(12) United States Patent
Shimizu

(10) Patent No.: US 11,936,226 B2
(45) Date of Patent: Mar. 19, 2024

(54) BATTERY CONTROL DEVICE, METHOD, PROGRAM, AND VEHICLE

(71) Applicant: TOYOTA JIDOSHA KABUSHIKI KAISHA, Toyota (JP)

(72) Inventor: Osamu Shimizu, Komaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 324 days.

(21) Appl. No.: 17/072,266

(22) Filed: Oct. 16, 2020

(65) Prior Publication Data

US 2021/0242699 A1 Aug. 5, 2021

(30) Foreign Application Priority Data

Feb. 3, 2020 (JP) ................................ 2020-016460

(51) Int. Cl.
```
B60L 58/12    (2019.01)
G01R 31/374   (2019.01)
G01R 31/382   (2019.01)
G01R 31/392   (2019.01)
H02J 7/00     (2006.01)
```

(52) U.S. Cl.
CPC ............ *H02J 7/0049* (2020.01); *B60L 58/12* (2019.02); *G01R 31/374* (2019.01); *G01R 31/382* (2019.01); *G01R 31/392* (2019.01); *B60L 2240/54* (2013.01)

(58) Field of Classification Search
CPC ... H02J 7/0049; G01R 31/392; G01R 31/382; G01R 31/374; B60L 58/12; B60L 2240/54
See application file for complete search history.

(56) References Cited

U.S. PATENT DOCUMENTS

| | | | |
|---|---|---|---|
| 2006/0022676 A1* | 2/2006 | Uesaka | G01R 31/3828 324/429 |
| 2008/0238371 A1 | 10/2008 | Tamezane | |
| 2008/0290833 A1* | 11/2008 | Hayashi | H02J 7/0048 320/137 |
| 2012/0212184 A1* | 8/2012 | Klein | H01M 10/448 320/134 |

(Continued)

FOREIGN PATENT DOCUMENTS

| | | |
|---|---|---|
| JP | 2008-241358 A | 10/2008 |
| JP | 2015-7616 A | 1/2015 |

(Continued)

*Primary Examiner* — Drew A Dunn
*Assistant Examiner* — Pamela J Jeppson
(74) *Attorney, Agent, or Firm* — Oblon, McClelland, Maier & Neustadt, L.L.P.

(57) ABSTRACT

A battery control device for controlling a battery includes an acquisition unit configured to acquire a state of the battery, and an estimation unit configured to estimate a full charge capacity of the battery by selecting, based on the state acquired by the acquisition unit, a first estimation method for estimating the full charge capacity of the battery based on an accumulated current value obtained by accumulating a charging current of the battery obtained by performing a charging process and a second estimation method for estimating the full charge capacity of the battery based on aging deterioration data showing a deterioration state of the battery with aging.

12 Claims, 10 Drawing Sheets

(56) References Cited

U.S. PATENT DOCUMENTS

| | | | | |
|---|---|---|---|---|
| 2017/0025869 A1* | 1/2017 | Lundholm | ........ | H02J 7/007194 |
| 2017/0274794 A1* | 9/2017 | Tenmyo | ................ | B60W 10/26 |
| 2020/0047634 A1 | 2/2020 | Akaishi et al. | | |

FOREIGN PATENT DOCUMENTS

| | | | |
|---|---|---|---|
| JP | 2017-62175 | A | 3/2017 |
| JP | 2017-91852 | A | 5/2017 |
| JP | 2017-96851 | A | 6/2017 |
| JP | 2020-24182 | A | 2/2020 |

* cited by examiner

US 11,936,226 B2

BATTERY CONTROL DEVICE, METHOD, PROGRAM, AND VEHICLE

CROSS-REFERENCE TO RELATED APPLICATION

This application claims priority to Japanese Patent Application No. 2020-016460 filed on Feb. 3, 2020, incorporated herein by reference in its entirety.

BACKGROUND

1. Technical Field

The present disclosure relates to a battery control device for controlling a battery.

2. Description of Related Art

A secondary battery capable of charging and discharging like a lithium-ion battery gradually deteriorates due to a decrease in a full charge capacity of a battery when charging and discharging are repeated. Since the deterioration of the battery affects a system using the battery, it is necessary to appropriately manage the full charge capacity of the battery. For example, Japanese Unexamined Patent Application Publication No. 2017-096851 (JP 2017-096851A), Japanese Unexamined Patent Application Publication No. 2008-241358 (JP 2008-241358 A), Japanese Unexamined Patent Application Publication No. 2017-062175 (JP 2017-062175A), and Japanese Unexamined Patent Application Publication No. 2017-091852 (JP 2017-091852A) variously disclose technologies for estimating a full charge capacity of a battery by using a current accumulation method, as a method for appropriately managing the full charge capacity of the battery.

SUMMARY

In a process of estimating the full charge capacity of the battery by using the current accumulation method, it is necessary to perform a charging and discharging process in which a difference in a state of charge is large to accurately estimate the full charge capacity. Therefore, when the estimation process of the full charge capacity is frequently performed with priority given to accuracy, deterioration of the battery may be promoted.

The present disclosure provides a battery control device configured to accurately estimate the full charge capacity of the battery while suppressing the deterioration acceleration of the battery.

A first aspect of the disclosure relates to a battery control device including an acquisition unit and an estimation unit. The acquisition unit is configured to acquire a state of the battery. The estimation unit is configured to estimate a full charge capacity of the battery by selecting, based on the state acquired by the acquisition unit, a first estimation method for estimating the full charge capacity of the battery based on an accumulated current value obtained by accumulating a charging current of the battery obtained by performing a charging process and a second estimation method for estimating the full charge capacity of the battery based on aging deterioration data showing a deterioration state of the battery with aging.

With the battery control device of the above aspect of the disclosure, since a full charge capacity estimation method using the current accumulation method and a full charge capacity estimation method using aging deterioration data are used separately based on at least a temperature of the battery, the full charge capacity of the battery can be estimated accurately while suppressing the deterioration acceleration of the battery.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

A battery control device of the above aspect of the disclosure performs an estimation of a full charge capacity of a battery, based on a state of the battery, by selectively using the first estimation method based on an accumulated charging current value obtained by making the battery a high voltage and the second estimation method based on aging deterioration data of the battery. Therefore, the full charge capacity of the battery can be appropriately estimated while suppressing the deterioration acceleration of the battery.

The battery control device of the above aspect of the disclosure can be mounted on, for example, a vehicle that employs a redundant power supply system and can switch between manual driving and autonomous driving. An embodiment of the present disclosure will be described in detail with reference to the drawings, taking an example of a case of being mounted on the vehicle.

First Embodiment

Configuration

Figure 1:
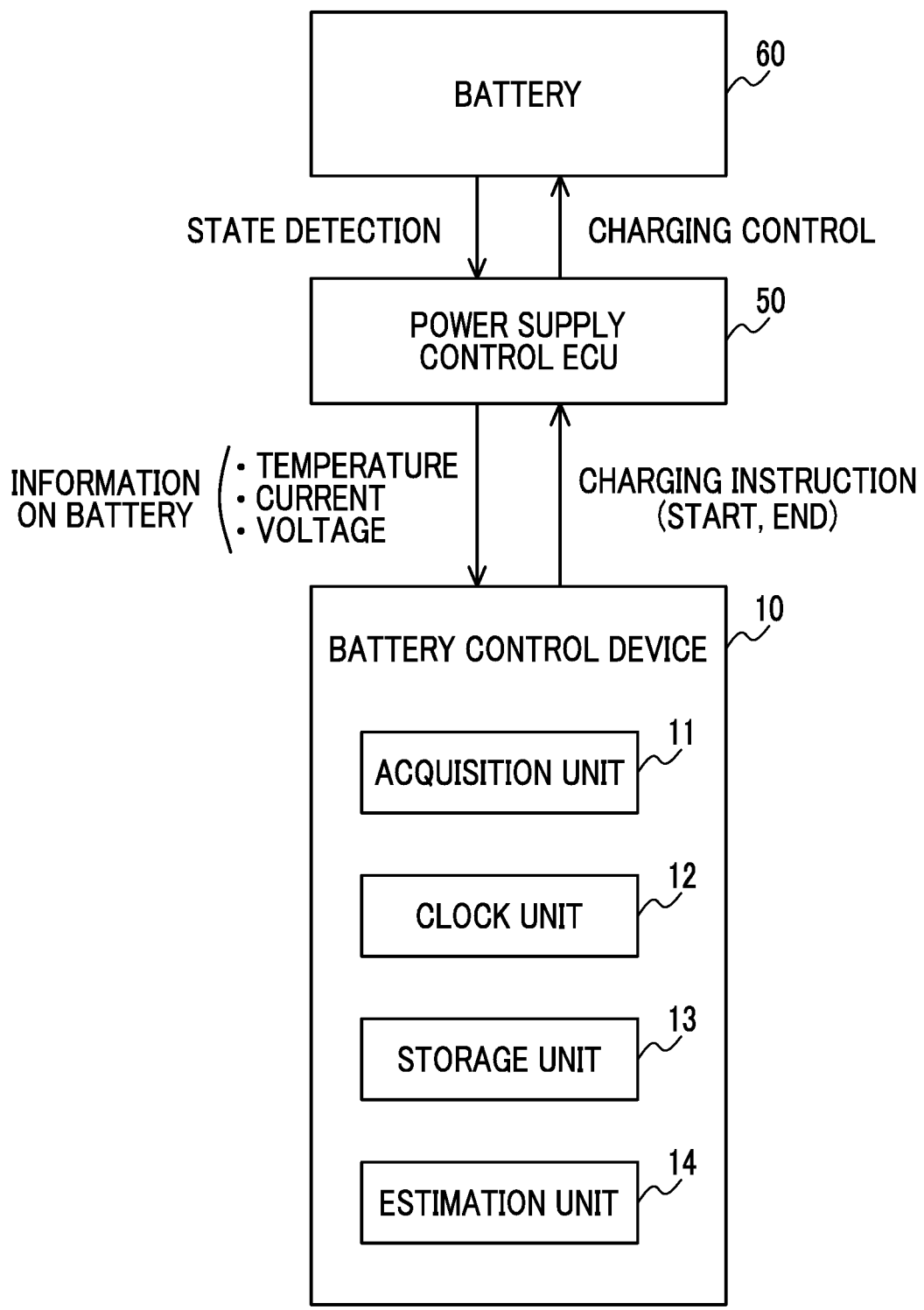
FIG. 1 is a functional block diagram of a battery control device and peripheral units thereof according to the first embodiment.

FIG. 1 is a functional block diagram of a battery control device 10 and peripheral units thereof according to the first embodiment. The functional block shown in FIG. 1 includes the battery control device 10, a power supply control ECU 50, and a battery 60. The battery control device 10 includes an acquisition unit 11, a clock unit 12, a storage unit 13, and an estimation unit 14.

The battery 60 is a secondary cell, such as a lead storage battery or a lithium-ion battery, configured to be able to charge and discharge. The battery 60 can supply electric power stored by itself to a device (not shown) such as an electronic device or an electrical component called an electronic control unit (ECU). In a case of being mounted on a vehicle capable of switching between manual driving and autonomous driving, the battery 60 can be used as a sub battery that backs up the main battery during autonomous driving.

The power supply control ECU 50 is an electronic device that controls the entire power supply system including the battery 60. The power supply control ECU 50 detects voltage, current, and temperature as information on the battery 60. The power supply control ECU 50 can include a part or all of an ECU that monitors the voltage, current, and temperature of the battery 60 by using, for example, a voltage sensor, a current sensor, and a temperature sensor. Information on the detected battery 60 (voltage, current, temperature) is output to the battery control device 10.

In addition, the power supply control ECU 50 also performs charging control of the battery 60 based on a charging instruction output from the battery control device 10. The power supply control ECU 50 can include a DCDC converter capable of controlling the voltage and current of the battery 60 and a part or all of an ECU capable of controlling the DCDC converter. The charging control is performed until the state of charge (SOC) of the battery 60 reaches a predetermined high state of charge.

The battery control device 10 executes control for estimating the full charge capacity of the battery 60. The battery control device 10 is typically configured as an ECU including a processor, a memory, an input and output interface, and the like, and the processor reads and executes a program stored in the memory, thereby realizing functions of each of the acquisition unit 11 to be described later, the clock unit 12, the storage unit 13, and the estimation unit 14.

The acquisition unit 11 acquires the information (voltage, current, temperature) on the battery 60 from the power supply control ECU 50.

The clock unit 12 measures a "timeout time", which is a time used to determine the end of a charging process performed on the battery 60. In addition, the clock unit 12 measures a "use period of the battery 60", which is a period showing the number of days and the time that has elapsed since the battery 60 was mounted on a vehicle to the present.

Figure 2:
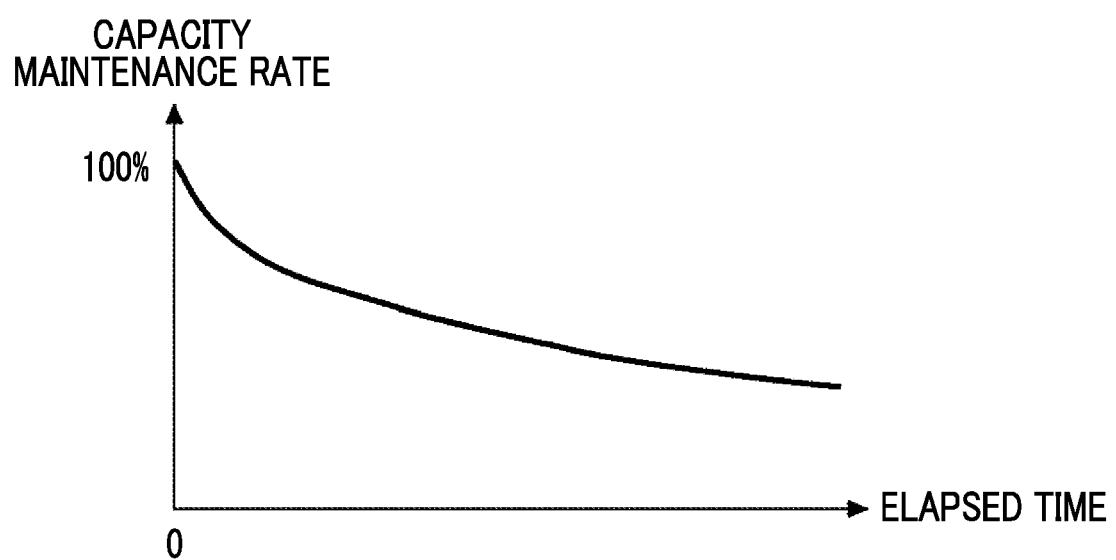
FIG. 2 is a diagram showing an example of aging deterioration data of a battery.

The storage unit 13 stores "aging deterioration data" which is data showing a deterioration state of the battery 60 with aging. The aging deterioration data is a capacity maintenance rate of the battery 60 with a time elapsed after the start of the use (or after being mounted on a vehicle), and is, as an example, data showing a ratio or difference of the full charge capacity after the deterioration to the full charge capacity when the battery is new in terms of elapsed years or elapsed days. FIG. 2 shows an example of the aging deterioration data of the battery 60. The storage unit 13 also stores the present full charge capacity of the battery 60. The full charge capacity stored in the storage unit 13 is updated with a newly estimated full charge capacity every time the full charge capacity of the battery 60 is estimated by the estimation unit 14 to be described later.

The estimation unit 14 appropriately performs a process of estimating the full charge capacity of the battery 60 based on the state of the battery 60. The state of the battery 60 includes the information on the battery 60 (voltage, current, temperature) acquired by the acquisition unit 11, the use period of the battery 60 measured by the clock unit 12, and the aging deterioration data of the battery 60 stored in the storage unit 13. When estimating the full charge capacity, any one method of the following first estimation method and second estimation method is selectively used.

The first estimation method is a method of estimating the full charge capacity of the battery 60 based on the accumulated current value obtained from the battery 60. The estimation according to the first estimation method is performed by performing a charging process for charging the battery 60 from the first voltage to the second voltage, and deriving the maximum state of charge that can be charged from the accumulated current value obtained by accumulating the charging current of the battery 60 detected in the charging process. A known current accumulation method can be used for this first estimation method. The first voltage is a present voltage of the battery 60, and the second voltage is a voltage corresponding to the state of charge of the battery 60 that is defined in advance as the end of the charging process.

The second estimation method is a method of estimating the full charge capacity of the battery 60 based on the aging deterioration of the battery 60. The estimation by the second estimation method is performed by correcting the full charge capacity of the battery 60 previously estimated and stored in the storage unit 13 with the aging deterioration data of the battery 60 stored in the storage unit 13 and a correction value derived from the use period of the battery 60 measured by the clock unit 12. For example, when the full charge capacity of the battery 60 previously estimated (stored in the storage unit 13) is "90%" and the correction value derived from the aging deterioration data at the present time when the use period is two years is "−5%", "85%" (=90%−5%) is estimated as a new full charge capacity (stored in the storage unit 13) of the battery 60.

In the first embodiment, how the first estimation method and the second estimation method are used separately to estimate the full charge capacity of the battery 60 will be described below.

Control

Figure 3:
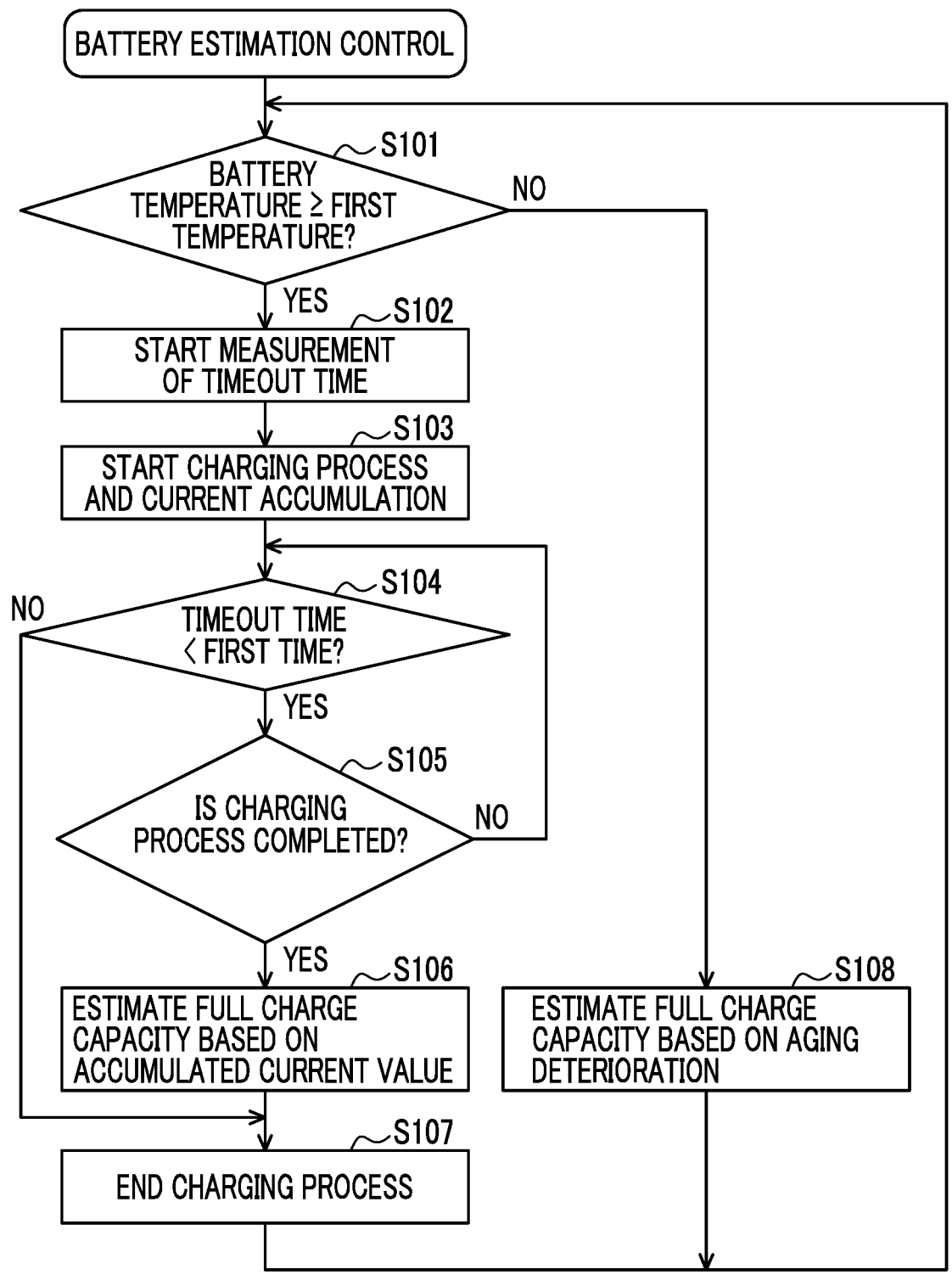
FIG. 3 is a processing flowchart of control performed by a battery control device according to the first embodiment.

Next, the control executed by the battery control device 10 according to the first embodiment will be described with further reference to FIG. 3. FIG. 3 is a flowchart showing a processing procedure of battery estimation control for estimating the full charge capacity of the battery 60 performed by the battery control device 10.

The battery estimation control shown in FIG. 3 starts when the power supply system of the vehicle is turned on (IG-ON, READY-ON, and the like) and is repeatedly executed until the power supply system is turned off (IG-OFF, READY-OFF, and the like).

Step S101: The estimation unit 14 of the battery control device 10 determines whether or not a temperature of the battery 60 acquired by the acquisition unit 11 is equal to or higher than the first temperature. The determination is performed to determine whether or not the state of the battery 60 is in a high temperature state in which deterioration tends to proceed. Therefore, the first temperature is set to an optimum temperature for determining the deterioration of the battery 60 based on the capacity and size of the battery 60 and a life period required for the battery 60.

When the temperature of the battery 60 is equal to or higher than the first temperature (S101, Yes), the estimation unit 14 determines that the battery 60 is in a state where deterioration is relatively likely to proceed, and the process proceeds to step S102. On the other hand, when the temperature of the battery 60 is lower than the first temperature (S101, No), the estimation unit 14 determines that the battery 60 is in a state where deterioration is relatively difficult to proceed, and the process proceeds to step S108.

Step S102: The estimation unit 14 of the battery control device 10 instructs the clock unit 12 to measure the timeout time. Based on the instruction, the clock unit 12 clears the timeout time and starts counting time from zero. This timeout time is used to determine the end of the charging process in step S104 to be described later. When the timeout time starts to be measured, the process proceeds to step S103.

Step S103: The estimation unit 14 of the battery control device 10 instructs the power supply control ECU 50 to start the charging process of the battery 60. Then, the estimation unit 14 starts accumulation of the charging current of the battery 60 acquired by the acquisition unit 11 together with the instruction of the charging process. When the charging process and current accumulation are started, the process proceeds to step S104.

Step S104: The clock unit 12 of the battery control device 10 determines whether or not the timeout time being counted is shorter than the first time. The determination is performed to determine whether or not the charging process may be continued as it is since errors (current sensor error and the like) included in the accumulated current value increase when the charging process takes a long time. Therefore, the first time is set to an optimum time within an allowable error range based on the accuracy required for the accumulated current value.

When the timeout time is shorter than the first time (S104, Yes), the process proceeds to step S105, and when the timeout time is equal to or longer than the first time (S104, No), the process proceeds to step S107.

Step S105: The estimation unit 14 of the battery control device 10 determines whether or not the battery 60 is in a state in which the charging process may be ended. The determination can be made, for example, by determining whether or not the battery control device 10 has acquired a voltage corresponding to the state of charge of the battery 60, which is defined in advance as the end of the charging process. The voltage corresponding to the state of charge is an open circuit voltage (OCV) that can be derived from a SOC-OCV characteristic curve of the battery 60. The open circuit voltage can be calculated from a close circuit voltage (CCV) of the battery 60 acquired by the acquisition unit 11.

When the charging process of the battery 60 is completed (S105, Yes), the process proceeds to step S106, and when the charging process of the battery 60 is not completed (S105, No), the process proceeds to step S104.

Step S106: The estimation unit 14 of the battery control device 10 estimates the full charge capacity of the battery 60 based on the accumulated current value obtained by the charging process (estimation using the first estimation method). The estimated full charge capacity is stored in the storage unit 13, and the full charge capacity of the battery 60 is updated. When the full charge capacity of the battery 60 is updated, the process proceeds to step S107.

Step S107: The estimation unit 14 of the battery control device 10 instructs the power supply control ECU 50 to end the charging process of the battery 60. When the charging process is ended, the process proceeds to step S101.

Step S108: The estimation unit 14 of the battery control device 10 estimates the full charge capacity of the battery 60 based on the aging deterioration data showing the deterioration state of the battery 60 with aging (estimation using the second estimation method). The estimated full charge capacity is stored in the storage unit 13, and the full charge capacity of the battery 60 is updated. When the full charge capacity of the battery 60 is updated, the process proceeds to step S101.

According to the above-described first embodiment, when the battery 60 is in a high temperature state (first temperature or higher) where deterioration is relatively likely to proceed, the full charge capacity is estimated with high accuracy by using the first estimation method (steps S103 to S107) for charging the battery 60 to a high voltage (high state of charge). On the other hand, when the battery 60 is in a low temperature state (less than the first temperature) where deterioration is relatively difficult to proceed, the full charge capacity is simply estimated by using the second estimation method (Step S108) for correcting the battery based on the aging deterioration data. By the control, the number of times the battery 60 becomes the high voltage (high state of charge) can be reduced, so that the full charge capacity of the battery 60 can be estimated while suppressing the deterioration acceleration of the battery 60.

Second Embodiment

Configuration

Figure 4:
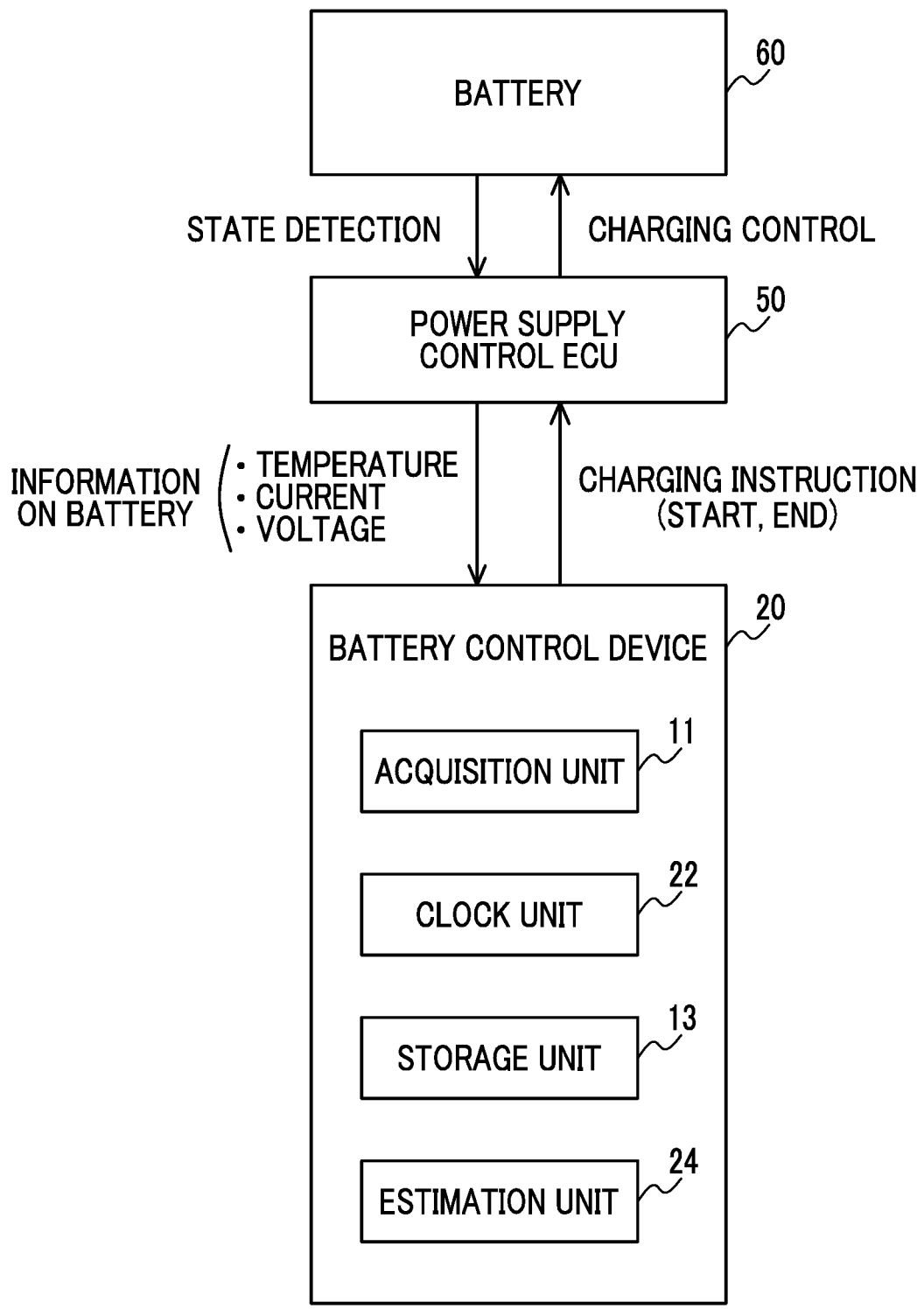
FIG. 4 is a functional block diagram of a battery control device and peripheral units thereof according to the second embodiment.

FIG. 4 is a functional block diagram of a battery control device 20 and peripheral units thereof according to the second embodiment. The functional block shown in FIG. 4 includes the battery control device 20, the power supply control ECU 50, and the battery 60. The battery control device 20 includes the acquisition unit 11, a clock unit 22, the storage unit 13, and an estimation unit 24.

The battery control device 20 according to the second embodiment differs from the battery control device 10 according to the first embodiment in a configuration of the battery control device 20. Hereinafter, the battery control device 20 will be described focusing on the different configuration. The same component as the component of the battery control device 10 in the battery control device 20 is designated by the same reference numerals, and the description thereof will be partially omitted.

The battery control device 20 executes control for estimating the full charge capacity of the battery 60. The battery control device 20 is typically configured as the ECU including the processor, the memory, the input and output interface, and the like, and the processor reads and executes the program stored in the memory, thereby realizing functions of each of the acquisition unit 11 to be described later, the clock unit 22, the storage unit 13, and the estimation unit 24.

The acquisition unit 11 acquires the information (voltage, current, temperature) on the battery 60 from the power supply control ECU 50.

The clock unit 22 measures the "timeout time", which is the time used to determine the end of the charging process performed on the battery 60. In addition, the clock unit 22 measures the "use period of the battery 60", which is the period showing the number of days and the time that has elapsed since the battery 60 was mounted on a vehicle to the present. Further, the clock unit 22 measures an "unlearned period of the battery 60", which is a period that has elapsed since the full charge capacity of the battery 60 was estimated last time by the estimation unit 24 to be described later (the number of days and hours), that is, a period in which the full charge capacity is not continuously estimated. It should be noted that immediately after the battery 60 is mounted on the vehicle or immediately after the battery 60 is replaced, the unlearned period is cleared and the measurement is newly started, as when the full charge capacity of the battery 60 is estimated.

The storage unit 13 stores the aging deterioration data of the battery 60 and the present full charge capacity of the battery 60, respectively. The full charge capacity is updated every time the estimation unit 24 to be described later estimates the full charge capacity of the battery 60.

The estimation unit 24 appropriately performs the process of estimating the full charge capacity of the battery 60 based on the state of the battery 60. The state of the battery 60 includes the information on the battery 60 (voltage, current, temperature) acquired by the acquisition unit 11, the use period and unlearned period of the battery 60 measured by the clock unit 22, and the aging deterioration data of the battery 60 stored in the storage unit 13. When estimating the full charge capacity, any one method of the above-described first estimation method and second estimation method is selectively used.

In the second embodiment, how the first estimation method and the second estimation method are used separately to estimate the full charge capacity of the battery 60 will be described below.

Control

Figure 5:
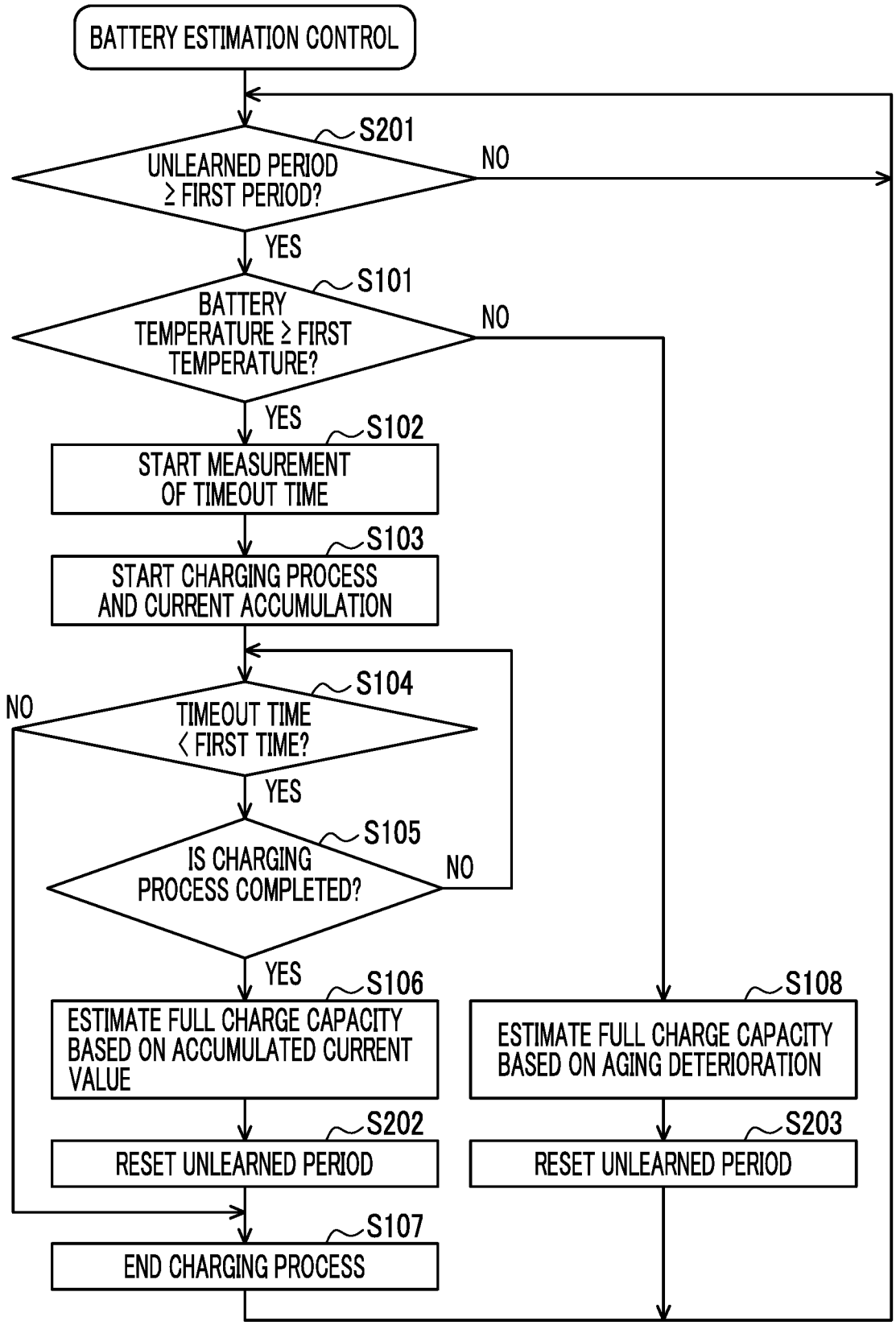
FIG. 5 is a processing flowchart of control performed by a battery control device according to the second embodiment.

Next, the control executed by the battery control device 20 according to the second embodiment will be described with further reference to FIG. 5. FIG. 5 is a flowchart showing a processing procedure of battery estimation control for estimating the full charge capacity of the battery 60 performed by the battery control device 20.

The flowchart shown in FIG. 5 is the flowchart of the first embodiment shown in FIG. 3 with processes of steps S201, S202, and S203 added thereto. It should be noted that since steps other than steps S201, S202, and S203 in FIG. 5 are the same as the process described in FIG. 3, a part of the description will be omitted.

When the power supply system of the vehicle is turned on and the battery estimation control is started, the process of step S201 is first performed.

Step S201: The estimation unit 24 of the battery control device 20 determines whether or not the unlearned period measured by the clock unit 22 is equal to or longer than the first period. The determination is made in order not to estimate the full charge capacity of the battery 60 more than necessary. Therefore, the first period is set to an optimum period based on the frequency, the minimum number of times, and the like of estimating the full charge capacity that is predetermined for quality control of the battery 60. For example, the first period can be set to two months, provided that the full charge capacity of the battery 60 is to be estimated at least once every two months.

When the unlearned period is equal to or longer than the first period (S201, Yes), the estimation unit 24 determines that it is time to estimate the full charge capacity of the battery 60, and the process proceeds to step S101. On the other hand, when the unlearned period is less than the first period (S201, No), the estimation unit 24 determines that it is not yet time to estimate the full charge capacity of the battery 60, and the process proceeds to step S201.

In step S106, the full charge capacity of the battery 60, which is estimated by using the first estimation method, is stored in the storage unit 13 and the full charge capacity of the battery 60 is updated, the process proceeds to step S202.

Step S202: The clock unit 22 of the battery control device 20 performs a "reset of the unlearned period" which clears the unlearned period of the battery 60 and newly starts the measurement. When the unlearned period is reset, the process proceeds to step S107.

In step S108, the full charge capacity of the battery 60, which is estimated by using the second estimation method, is stored in the storage unit 13 and the full charge capacity of the battery 60 is updated, the process proceeds to step S203.

Step S203: The clock unit 22 of the battery control device 20 performs the "reset of the unlearned period" which clears the unlearned period of the battery 60 and newly starts the measurement. When the unlearned period is reset, the process proceeds to step S101.

According to the above-described second embodiment, the full charge capacity of the battery 60 is estimated only when the estimation unit 24 determines that the full charge capacity of the battery 60 needs to be estimated (first period or more). As a result, frequent full charge capacity of the battery 60 can be suppressed.

Third Embodiment

Configuration

Figure 6:
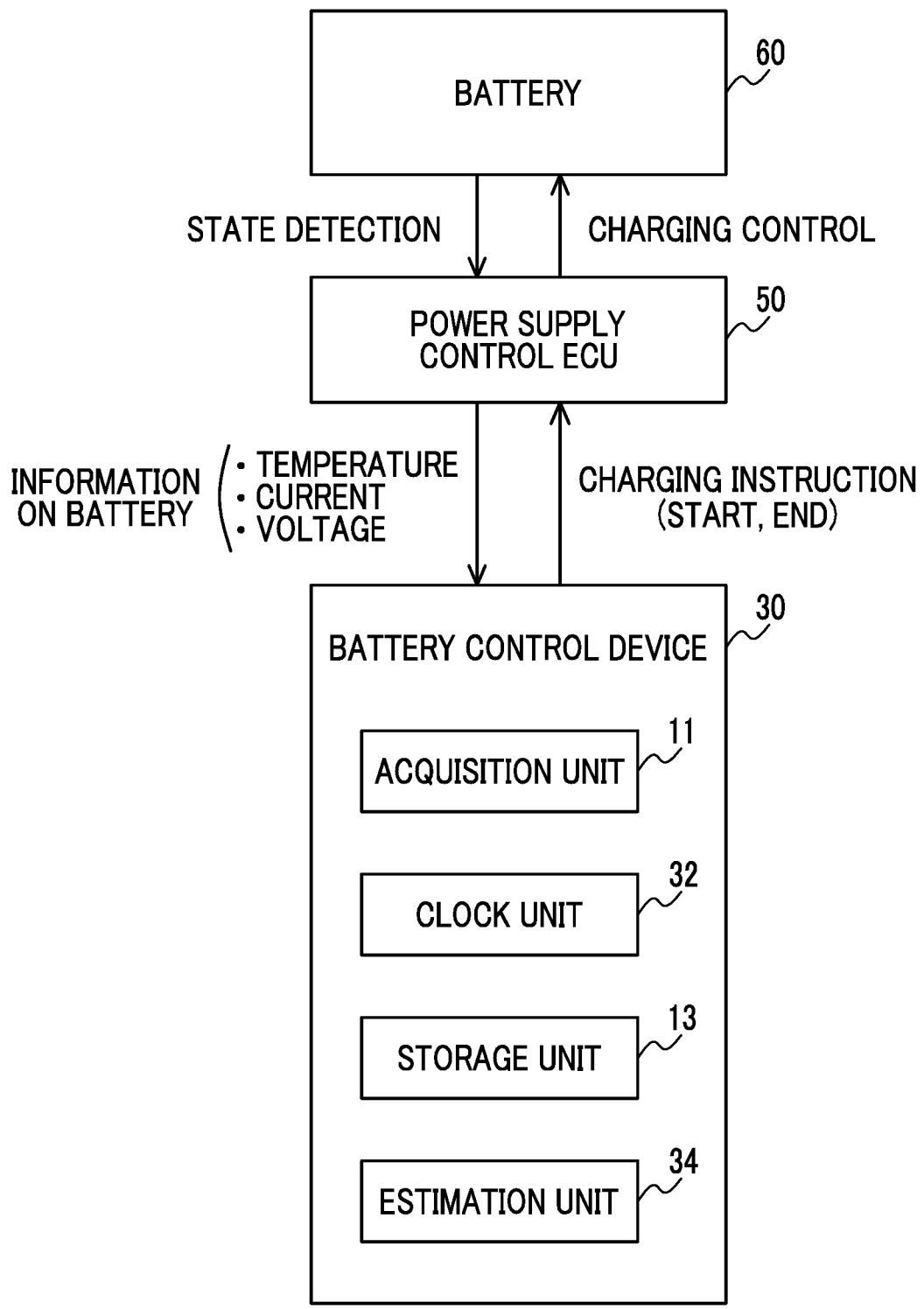
FIG. 6 is a functional block diagram of a battery control device and peripheral units thereof according to the third embodiment.

FIG. 6 is a functional block diagram of a battery control device 30 and peripheral units thereof according to the third embodiment. The functional block shown in FIG. 6 includes the battery control device 30, the power supply control ECU 50, and the battery 60. The battery control device 30 includes the acquisition unit 11, a clock unit 32, the storage unit 13, and an estimation unit 34.

The battery control device 30 according to the third embodiment differs from the battery control device 10 according to the first embodiment in a configuration of the battery control device 30. Hereinafter, the battery control device 30 will be described focusing on the different configuration. The same components as the components of the battery control devices 10 and 20 in the battery control device 30 are designated by the same reference numerals, and the description thereof will be partially omitted.

The battery control device 30 executes control for estimating the full charge capacity of the battery 60. The battery control device 30 is typically configured as the ECU including the processor, the memory, the input and output interface, and the like, and the processor reads and executes the program stored in the memory, thereby realizing functions of each of the acquisition unit 11 to be described later, the clock unit 32, the storage unit 13, and the estimation unit 34.

The acquisition unit 11 acquires the information (voltage, current, temperature) on the battery 60 from the power supply control ECU 50.

The clock unit 32 measures the "timeout time", which is the time used to determine the end of the charging process performed on the battery 60. In addition, the clock unit 32 measures the "use period of the battery 60", which is the period showing the number of days and the time that has elapsed since the battery 60 was mounted on a vehicle to the present. Further, the clock unit 32 measures an "unlearned period of the battery 60", which is a period that has elapsed since the full charge capacity of the battery 60 was estimated last time by the estimation unit 34 to be described later (the number of days and hours), that is, a period in which the full charge capacity is not continuously estimated. It should be noted that immediately after the battery 60 is mounted on the vehicle or immediately after the battery 60 is replaced, the unlearned period is cleared and the measurement is newly started, as when the full charge capacity of the battery 60 is estimated.

The storage unit 13 stores the aging deterioration data of the battery 60 and the present full charge capacity of the battery 60, respectively. The full charge capacity is updated every time the estimation unit 34 to be described later estimates the full charge capacity of the battery 60.

The estimation unit 34 appropriately performs the process of estimating the full charge capacity of the battery 60 based on the state of the battery 60. The state of the battery 60 includes the information on the battery 60 (voltage, current, temperature) acquired by the acquisition unit 11, the use period and unlearned period of the battery 60 measured by the clock unit 32, and the aging deterioration data of the battery 60 stored in the storage unit 13. When estimating the full charge capacity, any one method of the above-described first estimation method and second estimation method is selectively used.

In the third embodiment, how the first estimation method and the second estimation method are used separately to estimate the full charge capacity of the battery 60 will be described below.

Control

Figure 7:
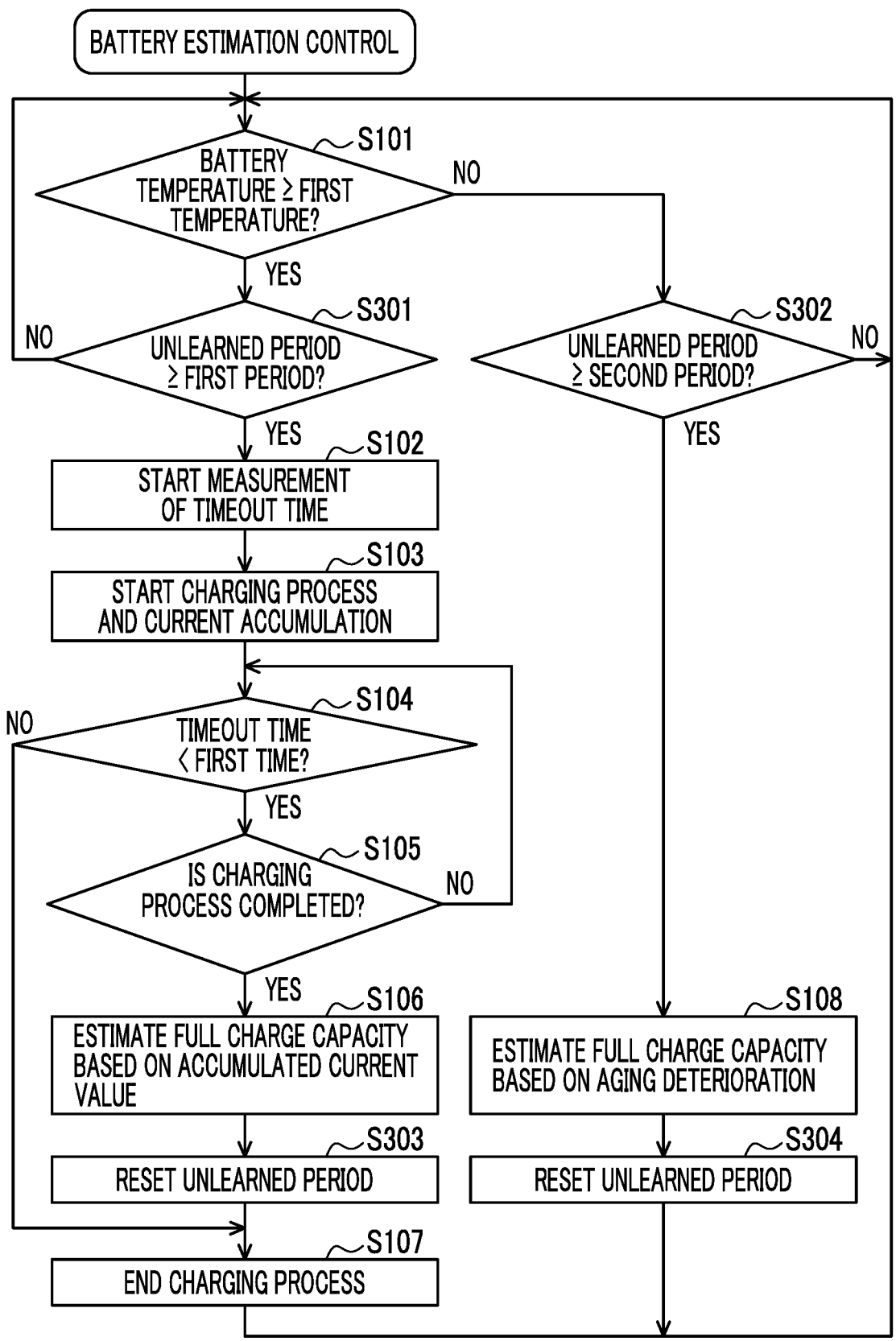
FIG. 7 is a processing flowchart of control performed by a battery control device according to the third embodiment.

Next, the control executed by the battery control device 30 according to the third embodiment will be described with further reference to FIG. 7. FIG. 7 is a flowchart showing a processing procedure of battery estimation control for estimating the full charge capacity of the battery 60 performed by the battery control device 30.

The flowchart shown in FIG. 7 is the flowchart of the first embodiment shown in FIG. 3 with processes of steps S301, S302, S303, and S304 added thereto. It should be noted that since steps other than steps S301, S302, S303, and S304 in FIG. 7 are the same as the process described in FIG. 3, a part of the description will be omitted.

In step S101, when the temperature of the battery 60 acquired by the acquisition unit 11 is equal to or higher than the first temperature (S101, Yes), the process proceeds to step S301, and when the temperature of the battery 60 is lower than the first temperature (S101, No), the process proceeds to step S302.

Step S301: The estimation unit 34 of the battery control device 30 determines whether or not the unlearned period measured by the clock unit 32 is equal to or longer than the first period. The determination is performed to limit the number of times that the estimation using the first estimation method in which the load is applied to the battery 60 is performed on the battery 60 that is in the high temperature state where deterioration is relatively likely to proceed. Therefore, the first period is set to an optimum period based on the frequency, the minimum number of times, and the like of estimating the full charge capacity that is predetermined for quality control of the battery 60.

For example, provided that the full charge capacity of the battery 60 is to be estimated at least twice every year, when a period during which the temperature of the battery 60 is equal to or higher than the first temperature is six months including summer, and when there is a possibility of failure that results in an incomplete estimate by timeout and the like once every two times, the first period may be set to two months. With the setting, it is possible to perform the estimation using the first estimation method three times out of six months during which the temperature of the battery 60 is equal to or higher than the first temperature, and even though the estimation fails two times out of three times, it is possible to perform the successful estimation one time. In this example, as the first period is shorter than two months, the number of times the estimation using the first estimation method is performed increases, and thus the load applied to the battery 60 increases. On the other hand, the more the first period is longer than two months, the more the load on the battery 60 can be reduced, but since the number of times the estimation using the first estimation method is performed decreases, there is a possibility that the regulation may not be satisfied due to the estimation failure. Therefore, it is desirable to set the first period as an optimum period based on a temperature environment (cold region or warm region) in which the battery 60 is used, while taking a trade-off into consideration.

When the unlearned period is equal to or longer than the first period (S301, Yes), the estimation unit 34 determines that it is time to estimate the full charge capacity of the battery 60, and the process proceeds to step S102. On the other hand, when the unlearned period is less than the first period (S301, No), the estimation unit 34 determines that it is not yet time to estimate the full charge capacity of the battery 60, and the process proceeds to step S101.

Step S302: The estimation unit 34 of the battery control device 30 determines whether or not the unlearned period measured by the clock unit 32 is equal to or longer than the second period. The determination is performed to limit the number of times that the estimation using the second estimation method is performed on the battery 60 that is in the low temperature state where deterioration is difficult to proceed. As in the first period, the second period is set as the optimum period based on the frequency and minimum number of times of estimating the full charge capacity predetermined for quality control of the battery 60, the temperature environment (cold region or warm region) in which the battery 60 is used, and the like.

Since the estimation using the second estimation method is an estimation by a correction that does not apply the load to the battery 60 and has no failure, it is not necessary to perform more estimation than the first estimation method. Therefore, provided that the full charge capacity of the battery 60 is to be estimated at least twice a year as in the above example, the second period can be set such that the estimation using the second estimation method can be performed at least once in a period of six months including winter when the temperature of the battery 60 becomes lower than the first temperature. Specifically, the second period can be set to three months such that the number of the estimation by the second estimation method is two times or less, which is less than the number of the estimation by the first estimation method, which is three times. In this way, the second period may be set longer than the first period.

When the unlearned period is equal to or longer than the second period (S302, Yes), the estimation unit 34 determines that it is time to estimate the full charge capacity of the battery 60, and the process proceeds to step S108. On the other hand, when the unlearned period is less than the second period (S302, No), the estimation unit 34 determines that it is not yet time to estimate the full charge capacity of the battery 60, and the process proceeds to step S101.

In step S106, the full charge capacity of the battery 60, which is estimated by using the first estimation method, is stored in the storage unit 13 and the full charge capacity of the battery 60 is updated, the process proceeds to step S303.

Step S303: The clock unit 32 of the battery control device 30 performs the "reset of the unlearned period" which clears the unlearned period of the battery 60 and newly starts the measurement. When the unlearned period is reset, the process proceeds to step S107.

In step S108, the full charge capacity of the battery 60, which is estimated by using the second estimation method, is stored in the storage unit 13 and the full charge capacity of the battery 60 is updated, the process proceeds to step S304.

Step S304: The clock unit 32 of the battery control device 30 performs the "reset of the unlearned period" which clears the unlearned period of the battery 60 and newly starts the measurement. When the unlearned period is reset, the process proceeds to step S101.

According to the above-described third embodiment, even when the battery 60 is in the high temperature state (first temperature or higher) where deterioration is relatively likely to proceed, assuming that the unlearned period is short (less than the first period), the full charge capacity of the battery 60 is not estimated. Thereby, the load applied to the battery 60 can be suppressed by the estimation using the first estimation method. On the other hand, even when the battery 60 is in the low temperature state (less than the first temperature) where deterioration is relatively difficult to proceed, assuming that the unlearned period is short (less than the second period), the full charge capacity of the battery 60 is not estimated. As a result, it is possible to suppress frequent estimation using the second estimation method during a period in which the full charge capacity of the battery 60 hardly fluctuates.

Fourth Embodiment

Configuration

Figure 8:
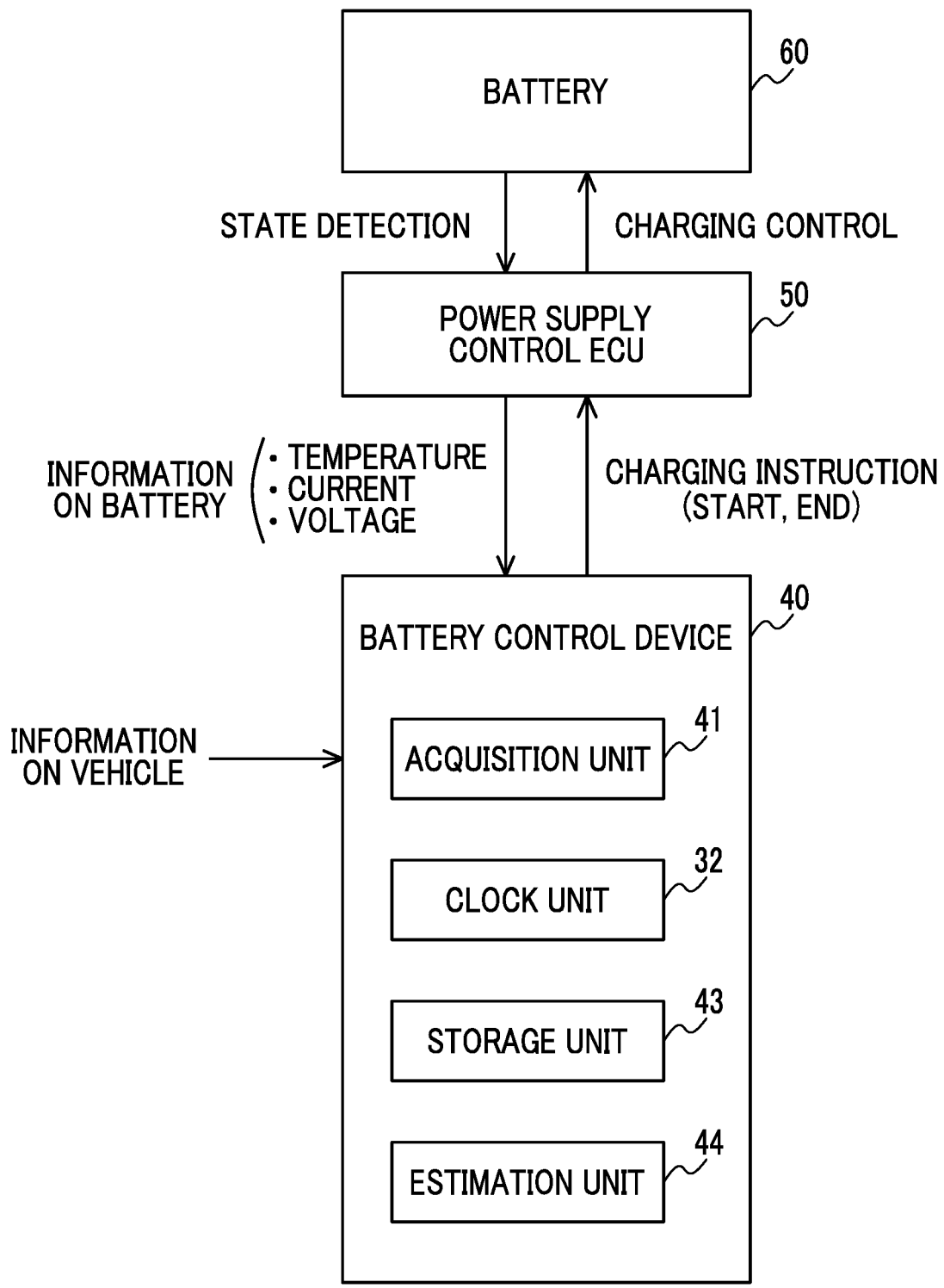
FIG. 8 is a functional block diagram of a battery control device and peripheral units thereof according to the fourth embodiment.

FIG. 8 is a functional block diagram of a battery control device 40 and peripheral units thereof according to the fourth embodiment. The functional block shown in FIG. 8 includes the battery control device 40, the power supply control ECU 50, and the battery 60. The battery control device 40 includes an acquisition unit 41, the clock unit 32, a storage unit 43, and an estimation unit 44.

The battery control device 40 according to the fourth embodiment differs from the battery control device 30 according to the third embodiment in a configuration of the battery control device 40. Hereinafter, the battery control device 40 will be described focusing on the different configuration. The same components as the components of the battery control devices 10 and 30 in the battery control device 40 are designated by the same reference numerals, and the description thereof will be partially omitted.

The battery control device 40 executes control for estimating the full charge capacity of the battery 60. The battery control device 40 is typically configured as the ECU including the processor, the memory, the input and output interface, and the like, and the processor reads and executes the program stored in the memory, thereby realizing functions of each of the acquisition unit 41 to be described later, the clock unit 32, the storage unit 43, and the estimation unit 44.

The acquisition unit 41 acquires the information (voltage, current, temperature) on the battery 60 from the power supply control ECU 50. In addition, the acquisition unit 41 acquires vehicle information showing whether the vehicle is performing manual driving or autonomous driving from an in-vehicle device (not shown).

The clock unit 32 measures the timeout time for determining the end of the charging process, the use period of the battery 60, and the unlearned period of the battery 60, respectively. It should be noted that immediately after the battery 60 is mounted on the vehicle or immediately after the battery 60 is replaced, the unlearned period is cleared and the measurement is newly started.

The storage unit 43 stores the aging deterioration data of the battery 60 and the present full charge capacity of the battery 60, respectively. The full charge capacity is updated every time the estimation unit 44 to be described later estimates the full charge capacity of the battery 60. In addition, the storage unit 43 stores "the number of the estimation" which is the number of times that the full charge capacity of the battery 60 is estimated by the estimation unit 44 between the time when the power supply system of the vehicle is turned on and the time when the power supply system of the vehicle is turned off (one trip).

The estimation unit 44 appropriately performs the process of estimating the full charge capacity of the battery 60 based on the state of the battery 60. The state of the battery 60 includes the information on the battery 60 (voltage, current, temperature) and vehicle information acquired by the acquisition unit 41, the use period and unlearned period of the battery 60 measured by the clock unit 22, and the aging deterioration data and the number of the estimation of the battery 60 stored in the storage unit 43. When estimating the full charge capacity, any one method of the above-described first estimation method and second estimation method is selectively used.

In the fourth embodiment, how the first estimation method and the second estimation method are used separately to estimate the full charge capacity of the battery 60 will be described below.

Figure 9:
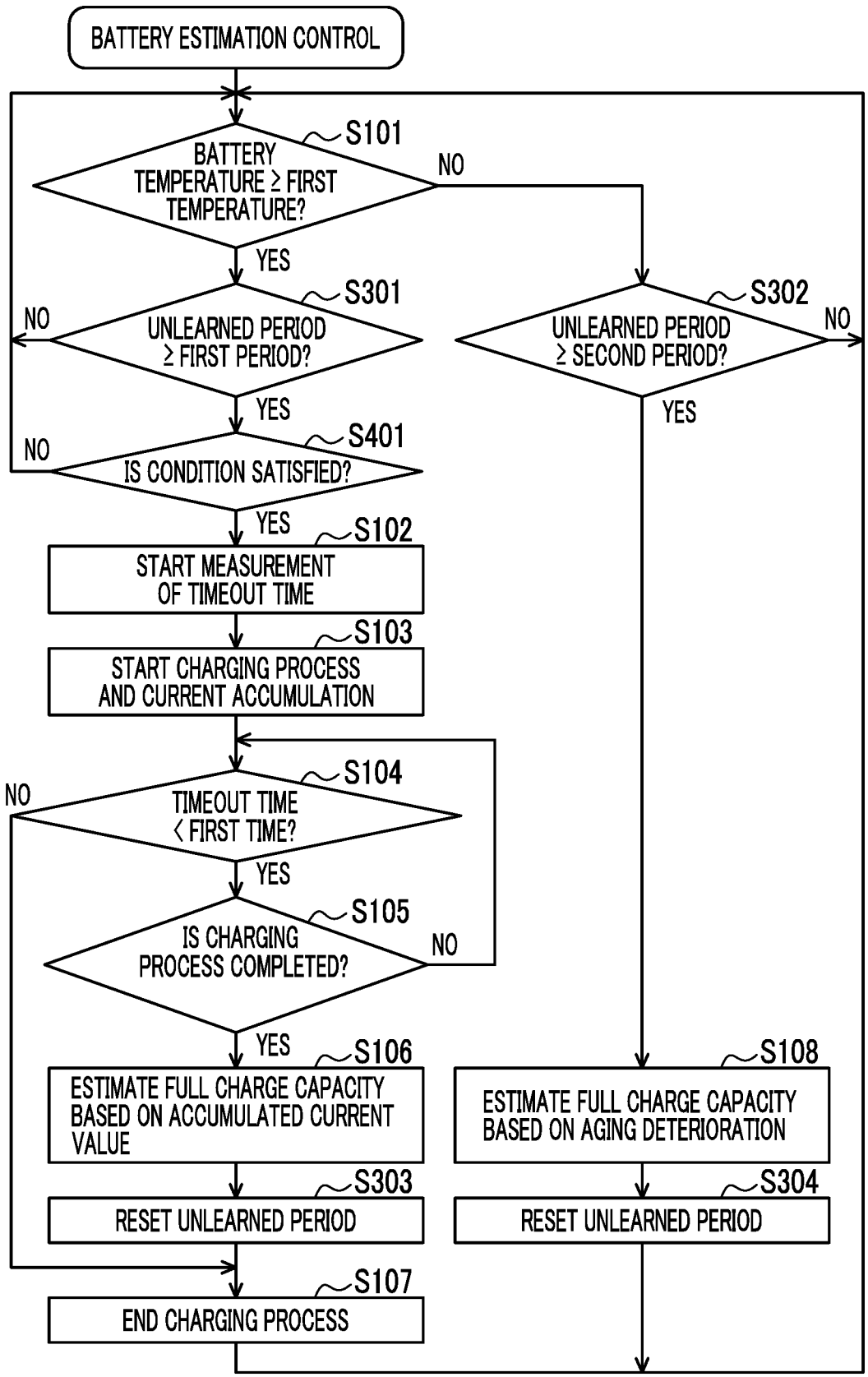
FIG. 9 is a processing flowchart of control performed by a battery control device according to the fourth embodiment.

Control Next, the control executed by the battery control device 40 according to the fourth embodiment will be described with further reference to FIG. 9. FIG. 9 is a flowchart showing a processing procedure of battery estimation control for estimating the full charge capacity of the battery 60 performed by the battery control device 40.

The flowchart shown in FIG. 9 is the flowchart of the third embodiment shown in FIG. 7 with the process of step S401 added thereto. It should be noted that since steps other than step S401 in FIG. 9 are the same as the process described in FIG. 7, a part of the description will be omitted.

When the unlearned period is equal to or longer than the first period in step S301 (S301, Yes), the process proceeds to step S401.

Step S401: The estimation unit 44 of the battery control device 40 determines whether or not a predetermined condition is satisfied. The predetermined condition is a condition that all of the following four items are established.

(First item): The present state of charge of the battery 60 is less than or equal to the first state of charge.

The item is an item for securing a fluctuation amount of the state of charge required to improve the estimation accuracy of the full charge capacity using the first estimation method. For example, when it is necessary to fluctuate the state of charge of the battery 60 by 20% or more in the charging process to improve the estimation accuracy of the full charge capacity, the first state of charge is set to 60% or less assuming that the state of charge at which the charging process is ended is defined as 80% in advance. Therefore, when this item is established, in the charging process of the first estimation method, it is possible to secure the fluctuation amount in the state of charge necessary to improve the estimation accuracy of the full charge capacity of the battery 60.

(Second item): A vehicle is in a manual driving state

This item is an item for suppressing large fluctuations in the voltage and current of the battery 60 that occur during the charging process performed in the first estimation method. Generally, when the vehicle is running in autonomous operation, the voltage and current of the battery 60 largely fluctuate since the battery 60 uses more electric power than the manual driving for sensing various sensors, automatically operating steer rigs and brakes, and the like. Such large fluctuations in the voltage and current of the battery 60 may affect the charging process. Therefore, when this item is established, fluctuations in the voltage and current of the battery 60 during the charging process of the first estimation method can be suppressed, and the estimation accuracy of the full charge capacity of the battery 60 can be improved.

(Third item): The process is the first estimation process in one trip.

This item is an item for suppressing the number of times the battery 60 becomes a high voltage (high state of charge) by the charging process performed in the first estimation method. The "trip" showing a so-called continuous operation period from when the power supply system of the vehicle is turned on to when the power supply system is turned off generally does not last as long as a week. Therefore, the estimation process of the full charge capacity of the battery 60 performed in one trip period is sufficient once. Therefore, when this item is established, the number of times the battery 60 becomes the high voltage (high state of charge) in one trip is only one, and the deterioration of the battery 60 can be suppressed.

(Fourth item): A start OCV of the battery 60 has been acquired.

The item is, like the first item, the item for securing the fluctuation amount of the state of charge required to improve the estimation accuracy of the full charge capacity using the first estimation method. The start OCV is an open circuit voltage corresponding to the present state of charge of the battery 60 that is less than or equal to the first state of charge. Since devices such as an ECU and electrical components are connected to the battery 60, it is necessary to perform processing such as calculation based on the stable voltage of the battery 60 to obtain the open circuit voltage. Therefore, when this item is established, the charging process of the first estimation method can be performed on the battery 60 in a stable state.

When the condition that all of the items are established is satisfied (S401, Yes), the process proceeds to step S102, and when the condition is not satisfied (S401, No), the process proceeds to step S101.

According to the above-described fourth embodiment, even when the battery 60 is in the high temperature state (first temperature or higher) where deterioration is relatively likely to proceed, and the unlearned period is long (the first period or longer), the full charge capacity of the battery 60 is not estimated unless the predetermined conditions are further satisfied. Thereby, the load applied to the battery 60 can be suppressed by the estimation using the first estimation method.

MODIFICATION EXAMPLE

In the battery estimation control according to the above-described fourth embodiment, when the estimation unit 44 determines that the condition that all of the items are established is not satisfied (S401, No), the full charge capacity of the battery 60 is not estimated (return to step S101). However, when the full charge capacity of the battery 60 is not estimated for a long period of time since the condition is not satisfied, a difference between the estimated full charge capacity of the battery 60 and the actual full charge capacity becomes large, which is not preferable as management of the battery 60.

Figure 10:
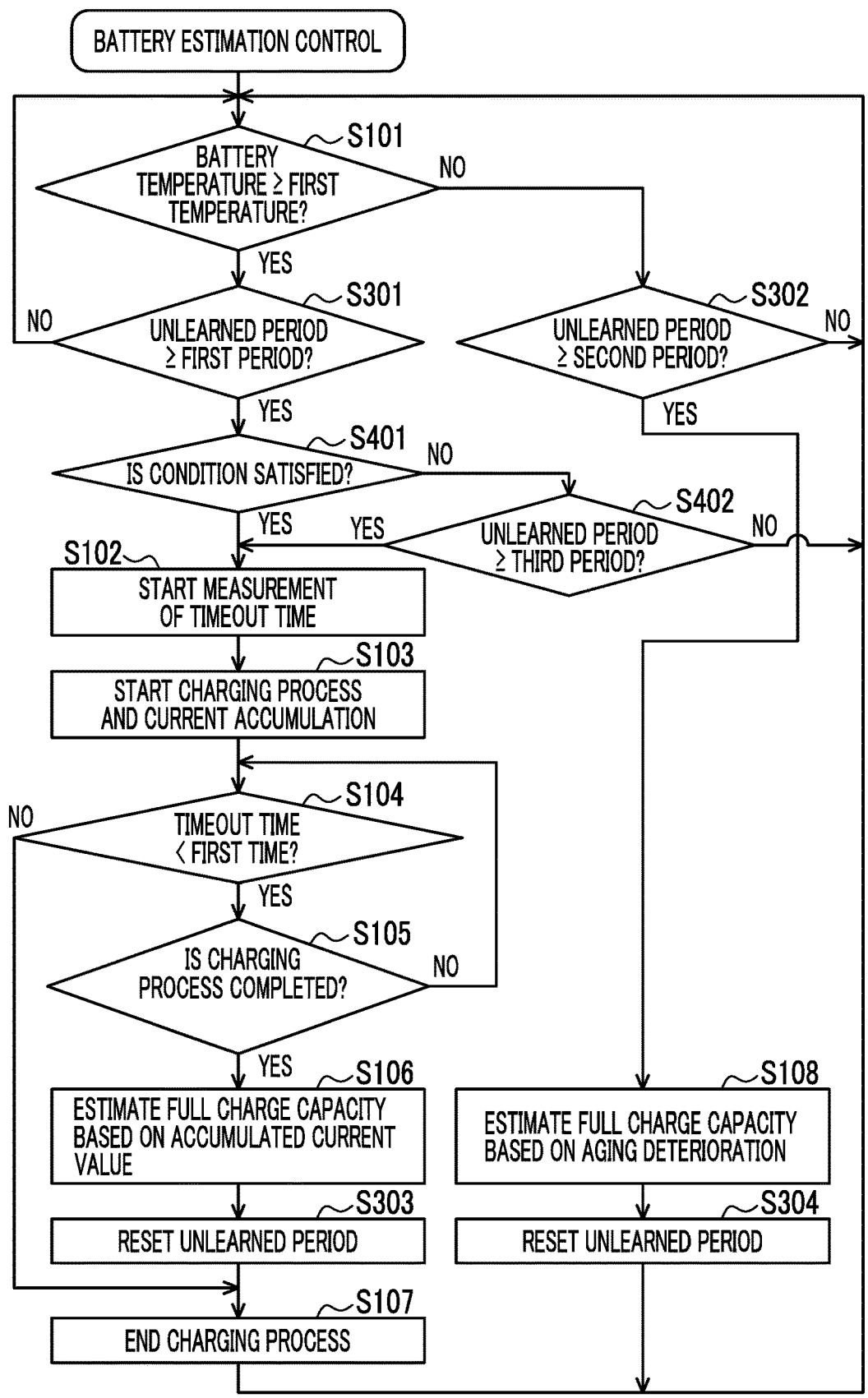
FIG. 10 is a modification example of a processing flowchart of control performed by a battery control device according to the fourth embodiment.

Therefore, in the battery estimation control of the modification example, as shown in the flowchart of FIG. 10, when the estimation unit 44 determines that the condition that all of the items are established is not satisfied in step S401 (S401, No), and further, in step S402, when the estimation unit 44 determines that whether or not the unlearned period measured by the clock unit 22 is equal to or longer than the third period and the unlearned period is equal to or longer than the third period (S402, Yes), the process proceeds to step S102 to estimate the full charge capacity of the battery 60. When the third period is set to be equal to or longer than the first period determined in step S101 and within the longest period during which the full charge capacity of the battery 60 need not be estimated, the estimation process of the full charge capacity of the battery 60 can be performed at intervals within the third period even though the condition is not satisfied for a long period of time Action and Effect In the battery control device according to each of the embodiments described above, based on the state of the battery including one or more of battery information (voltage, current, and temperature) and vehicle information, battery use period and unlearned period, and battery aging deterioration data and the number of the estimation, the estimation of the full charge capacity of the battery is performed by selectively using the first estimation method based on the accumulated charging current value obtained by making the battery the high voltage (high state of charge) and the second estimation method based on aging deterioration data of the battery. Therefore, the full charge capacity of the battery can be appropriately estimated while suppressing the deterioration acceleration of the battery.

In the battery control device, since the full charge capacity is estimated by using the first estimation method using current accumulation for charging the battery to the high voltage (high state of charge) only when the battery is in the high temperature state where deterioration of the battery is likely to proceed, the number of times the battery becomes the high voltage (high state of charge) can be reduced, so that the deterioration acceleration of the battery can be suppressed. In addition, for example, the battery in the high voltage (high state of charge) state after the full charge capacity is estimated is connected to the in-vehicle devices (ECU or electrical component), and the influence of the battery in the high voltage (high state of charge) state on the in-vehicle devices can be suppressed.

In addition, the present battery control device limits the number of times of processing for estimating the full charge capacity of the battery based on the unlearned period of the battery or the predetermined condition. As a result, the load applied to the battery can be suppressed by the estimation using the first estimation method, and the estimation using the second estimation method can be suppressed from being frequently performed in a period in which the full charge capacity of the battery hardly fluctuates.

One embodiment of the present disclosure has been described above, but the present disclosure can be viewed as a vehicle equipped with a battery control device, a battery control method executed by the battery control device having a processor and memory, a control program for executing the battery control method, a computer-readable non-temporary storage medium storing the control program, and a power supply system including the battery control device.

The battery control device of the above aspect of the disclosure can be used in a vehicle equipped with a battery.

What is claimed is:

1. A battery control device for controlling a battery, the battery control device configured to be mounted on a vehicle capable of autonomous driving and comprising:
circuitry configured to:
acquire a state of the battery;
estimate a full charge capacity of the battery by selecting, based on the state of the battery, from a first estimation method for estimating the full charge capacity of the battery and a second estimation method for estimating the full charge capacity of the battery;
perform the first estimation method including:
starting a charging process of charging the battery, and
estimating the full charge capacity of the battery based on an accumulated current value obtained by accumulating a charging current of the battery obtained by performing the charging process;
perform the second estimation method including estimating the full charge capacity of the battery without starting the charging process and based on aging deterioration data showing a deterioration state of the battery with aging;
measure an elapsed period that is a period that has elapsed since the full charge capacity of the battery was estimated a last time;
acquire a temperature of the battery as the state;
acquire vehicle information indicating whether the vehicle is in a state of manual driving or a state of autonomous driving;
estimate the full charge capacity of the battery by selecting the first estimation method when:
the temperature of the battery is equal to or higher than a first temperature,
the elapsed period is equal to or longer than a first period,
a state of charge of the battery is less than a first state of charge,
the vehicle is in the state of manual driving as opposed to the state of autonomous driving,
the estimation occurs within a single continuous operation period, and
an open circuit voltage of the battery is equal to or less than a first voltage;
estimate the full charge capacity of the battery by selecting the second estimation method when the temperature of the battery is lower than the first temperature and the elapsed period is equal to or longer than a second period longer than the first period; and
not estimate the full charge capacity of the battery when:
the temperature of the battery is equal to or higher than the first temperature,
the elapsed period is equal to or longer than the first period,
the state of charge of the battery is not less than the first state of charge,
the vehicle is in the state of autonomous driving as opposed to the state of manual driving,
the estimation has previously occurred within the single continuous operation period, and
the open circuit voltage of the battery is not equal to or less than the first voltage.

2. The battery control device according to claim 1, wherein the circuitry is configured to:
estimate the full charge capacity of the battery by selecting the first estimation method when the temperature of the battery is equal to or higher than the first temperature; and
estimate the full charge capacity of the battery by selecting the second estimation method when the temperature of the battery is lower than the first temperature.

3. The battery control device according to claim 1, wherein the circuitry is configured to:
estimate the full charge capacity of the battery by selecting from the first estimation method and the second estimation method based on the state of the battery when the elapsed period is equal to or longer than the first period.

4. The battery control device according to claim 3, wherein the circuitry is configured to not estimate the full charge capacity of the battery when the elapsed period is shorter than the first period.

5. The battery control device according to claim 1, wherein:
the first period is set based on a number of days in which the temperature of the battery is equal to or higher than the first temperature in one year; and
the second period is set based on a number of days in which the temperature of the battery is lower than the first temperature in one year.

6. The battery control device according to claim 5, wherein the circuitry is configured to
not estimate the full charge capacity of the battery when the temperature of the battery is equal to or higher than the first temperature and the elapsed period is shorter than the first period; and
not estimate the full charge capacity of the battery when the temperature of the battery is lower than the first temperature and the elapsed period is shorter than the second period.

7. The battery control device according to claim 1, wherein the circuitry is configured to estimate the full charge capacity of the battery by selecting the first estimation method in a case where the elapsed period exceeds a third period longer than the first period even though first estimation method conditions are not satisfied, when the temperature of the battery is equal to or higher than the first temperature and the elapsed period is equal to or longer than the first period.

8. The battery control device according to claim 7, wherein the circuitry is configured to not estimate the full charge capacity of the battery in a case where the elapsed period does not exceed the third period even though the conditions are not satisfied, when the temperature of the battery is equal to or higher than the first temperature and the elapsed period is equal to or longer than the first period.

9. A vehicle equipped with the battery control device according to claim 1.

10. The battery control device according to claim 1, wherein the circuitry is configured to
not estimate the full charge capacity of the battery when the temperature of the battery is equal to or higher than the first temperature and the elapsed period is shorter than the first period; and
not estimate the full charge capacity of the battery when the temperature of the battery is lower than the first temperature and the elapsed period is shorter than the second period.

11. A control method executed by a computer of a battery control device that is configured to be mounted on a vehicle capable of autonomous driving and equipped with a battery, the control method comprising:

acquiring a state of the battery;

estimating a full charge capacity of the battery by a first estimation method including:
starting a charging process of charging the battery, and estimating the full charge capacity of the battery based on based on an accumulated current value obtained by accumulating a charging current of the battery obtained by performing the charging process;

estimating the full charge capacity of the battery by a second estimation method without starting the charging process and based on aging deterioration data showing a deterioration state of the battery with aging; and selecting one of the first estimation method and the second estimation method based on the state of the battery;

measuring an elapsed period that is a period that has elapsed since the full charge capacity of the battery was estimated a last time;

acquiring a temperature of the battery as the state;

acquiring vehicle information indicating whether the vehicle is in a state of manual driving or a state of autonomous driving;

estimating the full charge capacity of the battery by selecting the first estimation method when:
the temperature of the battery is equal to or higher than a first temperature,
the elapsed period is equal to or longer than a first period,
a state of charge of the battery is less than a first state of charge,
the vehicle is in the state of manual driving as opposed to the state of autonomous driving,
the estimation occurs within a single continuous operation period, and
an open circuit voltage of the battery is equal to or less than a first voltage;

estimating the full charge capacity of the battery by selecting the second estimation method when the temperature of the battery is lower than the first temperature and the elapsed period is equal to or longer than a second period longer than the first period; and not estimating the full charge capacity of the battery when:
the temperature of the battery is equal to or higher than the first temperature,
the elapsed period is equal to or longer than the first period,
the state of charge of the battery is not less than the first state of charge,
the vehicle is in the state of autonomous driving as opposed to the state of manual driving,
the estimation has previously occurred within the single continuous operation period, and
the open circuit voltage of the battery is not equal to or less than the first voltage.

12. A non-transitory computer readable medium storing a control program that when executed by a computer causes the computer to perform a method, the method comprising:

acquiring a state of a battery mounted on a vehicle capable of autonomous driving;

estimating a full charge capacity of the battery by a first estimation method including:
starting a charging process of charging the battery, and estimating the full charge capacity of the battery based on based on an accumulated current value obtained by accumulating a charging current of the battery obtained by performing the charging process;

estimating the full charge capacity of the battery by a second estimation method without starting the charging process and based on aging deterioration data showing a deterioration state of the battery with aging;

selecting one of the first estimation method and the second estimation method based on the state of the battery;

measuring an elapsed period that is a period that has elapsed since the full charge capacity of the battery was estimated a last time;

acquiring a temperature of the battery as the state;

acquiring vehicle information indicating whether the vehicle is in a state of manual driving or a state of autonomous driving;

estimating the full charge capacity of the battery by selecting the first estimation method when:
the temperature of the battery is equal to or higher than a first temperature,
the elapsed period is equal to or longer than a first period,
a state of charge of the battery is less than a first state of charge,
the vehicle is in the state of manual driving as opposed to the state of autonomous driving,
the estimation occurs within a single continuous operation period, and
an open circuit voltage of the battery is equal to or less than a first voltage;

estimating the full charge capacity of the battery by selecting the second estimation method when the temperature of the battery is lower than the first temperature and the elapsed period is equal to or longer than a second period longer than the first period; and not estimating the full charge capacity of the battery when:
the temperature of the battery is equal to or higher than the first temperature,
the elapsed period is equal to or longer than the first period,
the state of charge of the battery is not less than the first state of charge,
the vehicle is in the state of autonomous driving as opposed to the state of manual driving,
the estimation has previously occurred within the single continuous operation period, and
the open circuit voltage of the battery is not equal to or less than the first voltage.

* * * * *